(12) United States Patent
Cho

(10) Patent No.: US 10,712,594 B2
(45) Date of Patent: Jul. 14, 2020

(54) FLAT DISPLAY PANEL AND METHOD OF MANUFACTURING THE SAME

(71) Applicant: LG Display Co., Ltd., Seoul (KR)

(72) Inventor: Suk-Ho Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/980,098

(22) Filed: May 15, 2018

(65) Prior Publication Data

US 2018/0329248 A1 Nov. 15, 2018

(30) Foreign Application Priority Data

May 15, 2017 (KR) .................. 10-2017-0060014

(51) Int. Cl.
| | |
|---|---|
| *H01L 27/12* | (2006.01) |
| *G02F 1/133* | (2006.01) |
| *G02F 1/1368* | (2006.01) |
| *G02F 1/1362* | (2006.01) |
| *H01L 27/32* | (2006.01) |
| *G02F 1/1333* | (2006.01) |
| *H01L 29/49* | (2006.01) |
| *H01L 21/027* | (2006.01) |

(Continued)

(52) U.S. Cl.
CPC ........ *G02F 1/13318* (2013.01); *G02F 1/1368* (2013.01); *G02F 1/133345* (2013.01); *G02F 1/136227* (2013.01); *G02F 1/136286* (2013.01); *H01L 27/124* (2013.01); *H01L 27/1248* (2013.01); *H01L 27/1262* (2013.01); *H01L 27/1288* (2013.01); *H01L 27/3227* (2013.01); *H01L 27/3269* (2013.01); *G02F 2001/133357* (2013.01); *G02F 2001/136295* (2013.01); *H01L 21/0274* (2013.01); *H01L 21/32133* (2013.01); *H01L 29/4908* (2013.01); *H01L 29/518* (2013.01)

(58) Field of Classification Search
CPC ..... G02F 1/13318; G02F 2001/133388; G02F 2001/133357; H01L 27/3227; H01L 27/3269; H01L 27/3225; H01L 27/1248
See application file for complete search history.

(56) References Cited

U.S. PATENT DOCUMENTS

| | | | | |
|---|---|---|---|---|
| 2016/0211307 A1* | 7/2016 | Kim | ................. | H01L 51/5225 |
| 2018/0315357 A1* | 11/2018 | Nam | ................. | G09F 13/22 |
| 2019/0285922 A1* | 9/2019 | Sun | ................. | H01L 27/156 |

FOREIGN PATENT DOCUMENTS

JP 2010-20045 A 1/2010

* cited by examiner

*Primary Examiner* — Jaehwan Oh
*Assistant Examiner* — Evan G Clinton
(74) *Attorney, Agent, or Firm* — Seed Intellectual Property Law Group LLP

(57) ABSTRACT

Disclosed are a flat display panel that is capable of preventing a different appearance between a camera index light source (CIL) and an ambient light sensor hole and a method of manufacturing the same. The flat display panel is configured such that, on a first substrate, partitioned into a pixel region of a display area and a CIL hole part and an ambient light sensor hole part of a non-display area, a gate insulating layer, a first passivation film, a planarization film, and a second passivation film are not present at the CIL hole part or at the ambient light sensor hole part or such that only the planarization film is present at the CIL hole part and the ambient light sensor hole part.

12 Claims, 5 Drawing Sheets

(51) Int. Cl.
*H01L 21/3213* (2006.01)
*H01L 29/51* (2006.01)

FLAT DISPLAY PANEL AND METHOD OF MANUFACTURING THE SAME

CROSS-REFERENCE TO RELATED APPLICATION(S)

This application claims the benefit of Korean Patent Application No. 10-2017-0060014, filed May 15, 2017, which is hereby incorporated by reference as if fully set forth herein.

BACKGROUND

Technical Field

The present disclosure relates to a display panel, and more particularly to a flat display panel having a camera, an ambient light sensor, and a camera index light source mounted therein and a method of manufacturing the same.

Description of the Related Art

With the advent of the information society, the field of displays for processing and displaying a large amount of information has been rapidly developed in recent years. In order to satisfy demand resulting therefrom, various flat display devices have been developed and used.

Representative examples of a flat panel display that displays images using digital data include a liquid crystal display (LCD) panel, which uses liquid crystals, and an organic light-emitting diode (OLED) display panel, which uses OLEDs.

The liquid crystal display panel has a large contrast ratio, is suitable for displaying video, and has low power consumption. For these reasons, the liquid crystal display panel is being utilized in various fields, such as laptop computers, monitors, and TVs. In the liquid crystal display panel, an image is realized using optical anisotropy and polarization characteristics of liquid crystals. The liquid crystals have optical anisotropy, in which the molecular structure of the liquid crystals is elongated and the liquid crystals are arranged while having directivity, and polarization characteristics, in which the direction in which liquid crystal molecules are arranged changes depending on the size of the liquid crystals when the liquid crystals are placed in an electric field.

The liquid crystal display panel includes a thin film transistor array substrate having a thin film transistor array formed on a glass substrate, a color filter array substrate having a color filter array formed on a glass substrate, and a liquid crystal layer disposed between the thin film transistor array substrate and the color filter array substrate. A voltage is applied to an electric field generation electrode to generate an electric field in the liquid crystal layer, whereby the direction in which liquid crystal molecules in the liquid crystal layer are arranged is set, and the polarization of incident light is controlled in order to display an image.

The OLED display panel does not need an additional light source, since the OLED display panel is self-emissive. In the OLED display panel, an image is displayed through a display substrate having thin film transistors and organic light-emitting devices formed thereon.

In recent years, the flat display panel has been actively applied to personal portable electronic devices, such as mobile phones and personal digital assistants (PDAs), as well as TVs and monitors. A camera is mounted in the flat display panel in order to realize the functions of a camera phone and a video phone. In addition, an ambient light sensor is mounted in the flat display panel in order to sense the intensity of light around the flat display panel, which is used as data necessary to automatically adjust the brightness of a screen of the display panel.

FIG. 1 is a plan view schematically showing a liquid crystal display panel, in which a general camera and an ambient light sensor are mounted, and FIG. 2 is a sectional view showing the structure of a first substrate of FIG. 1.

As shown in FIG. 1, a general liquid crystal display panel 110 is configured such that a first substrate 112, which is a thin film transistor array substrate, and a second substrate 114, which is a color filter array substrate, are laminated in the state in which a liquid crystal layer (not shown) is interposed therebetween.

The liquid crystal display panel 110 generally includes a display area AA, on which an image is displayed, and a non-display area NA, on which various circuits and wires are formed and which is thus not used to display an image. On the display area AA of the first substrate 112, a plurality of data lines DL and a plurality of gate lines GL intersect each other lengthwise and crosswise to define pixels P. A thin film transistor T is provided at the intersection of each of the data lines DL and a corresponding one of the gate lines GL so as to be individually connected to a transparent pixel electrode (not shown) provided at each pixel P.

In order to prevent the leakage of the liquid crystal layer (not shown), which is disposed between the two substrates 112 and 114, a seal pattern 210 is formed along the edge of the non-display area NA of the substrates 112 and 114.

A data pad unit 250 is formed at one side of the non-display area NA of the first substrate 112, and a gate-driving unit 240 is formed at the edge of the non-display area NA of the first substrate 112 that is perpendicular to the side of the non-display area NA of the first substrate 112 at which the data pad unit 250 is formed.

The data pad unit 250 includes a plurality of data pad electrodes (not shown). The data pad electrodes (not shown) are connected to connection members 116, on each of which a data-driving circuit 260 is mounted, by tape automated bonding (TAB).

The data-driving circuits 260, which are mounted on the respective connection members 116, receive control signals and image signals input from an external driving circuit unit (not shown) via signal wires (not shown) mounted on a data printed circuit board (PCB) 117, which is connected to the connection members 116. In addition, the data-driving circuits 260 are connected to each other.

The gate-driving unit 240 sequentially generates gate signals for turning on the thin film transistors using a gate control signal received from the external driving circuit unit (not shown), and supplies the gate signals to the gate lines GL.

Consequently, the optical transmittance of the liquid crystal layer (not shown) is controlled by an electric field generated between a pixel electrode (not shown) and a common electrode (not shown) according to a data signal supplied for each pixel P, whereby an image is displayed.

A camera hole 230, a camera index light source (CIL) hole 231, and an ambient light sensor hole 232 are provided in the non-display area NA of the liquid crystal panel 110, on which no image is displayed.

The structure of the first substrate 112 of the liquid crystal display panel, in which the camera and the ambient light sensor are mounted, is shown in FIG. 2.

That is, FIG. 2 is a sectional view showing a pixel region Pixel of the display area AA, the CIL hole part 231, and the ambient light sensor hole part 232.

A thin film transistor TFT, having a gate electrode 11, a gate insulating layer 12, an active layer 13, and source/drain electrodes 14a and 14b, is formed in the pixel region Pixel of the first substrate 112. A first passivation film 15, a planarization film 16, and a second passivation film 17 are sequentially stacked on the entire surface of the first substrate 112, including the thin film transistor TFT.

The second passivation film 17, the planarization film 16, and the first passivation film 15 above the drain electrode 14b are selectively removed to form a contact hole 20, and a pixel electrode 18 is formed so as to be electrically connected to the drain electrode 14b via the contact hole 20.

In the case in which the liquid crystal display panel 110 is in an IPS mode, a common electrode 23 is formed between the second passivation film 17 and the planarization film 16.

Meanwhile, the CIL hole part 231 has a structure in which the gate insulating layer 12, the first passivation film 15, the planarization film 16, and the second passivation film 17 are sequentially stacked on the first substrate 112.

The ambient light sensor hole part 232 has a structure in which the gate insulating layer 12, the first passivation film 15, and the second passivation film 17 are sequentially stacked on the first substrate 112 and in which a polymer film 21 is provided on the second passivation film 17.

The liquid crystal display panel having the above structure, in which the general camera and the ambient light sensor are mounted, has the following problems.

As described above, the CIL hole part 231 has a structure in which the gate insulating layer 12, the first passivation film 15, the planarization film 16, and the second passivation film 17 are sequentially stacked on the first substrate 112, and the ambient light sensor hole part 232 has a structure in which the gate insulating layer 12, the first passivation film 15, and the second passivation film 17 are sequentially stacked on the first substrate 112 and in which the polymer film 21 is provided on the second passivation film 17. When camera light is turned off under normal luminance conditions, therefore, a viewed appearance is different at a side viewing angle between the CIL hole and the ambient light sensor hole.

That is, a region between the CIL hole and the ambient light sensor hole appears brighter than the CIL hole region or the ambient light sensor hole region.

BRIEF SUMMARY

Accordingly, the present disclosure is directed to a flat display panel and a method of manufacturing the same that substantially obviate one or more problems due to limitations and disadvantages of the related art.

An object of the present disclosure is to provide a flat display panel configured such that a CIL hole and an ambient light sensor hole have the same sectional structure in order to prevent a different appearance between the CIL hole and the ambient light sensor hole and a method of manufacturing the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a flat display panel is configured such that, on a first substrate, partitioned into a pixel region of a display area and a CIL hole part and an ambient light sensor hole part of a non-display area, a gate insulating layer, a first passivation film, a planarization film, and a second passivation film are not present at the CIL hole part or at the ambient light sensor hole part.

In another aspect of the present disclosure, a flat display panel is configured such that, on a first substrate, partitioned into a pixel region of a display area and a CIL hole part and an ambient light sensor hole part of a non-display area, only a planarization film is present at the CIL hole part and the ambient light sensor hole part.

In another aspect of the present disclosure, a method of manufacturing a flat display panel includes preparing a first substrate, partitioned into a pixel region of a display area and a CIL hole part and an ambient light sensor hole part of a non-display area, forming a gate electrode on the first substrate at the pixel region, forming a gate insulating layer on the entire surface of the first substrate including the pixel region, the CIL hole part, and the ambient light sensor hole part, forming an active layer and source/drain electrodes on the gate insulating layer at the pixel region, sequentially forming a first passivation film and a planarization film on the entire surface of the first substrate including the pixel region, the CIL hole part, and the ambient light sensor hole part, selectively removing the planarization film above the drain electrode, the CIL hole part, and the ambient light sensor hole part, forming a second passivation film on the entire surface of the first substrate including the pixel region, the CIL hole part, and the ambient light sensor hole part, removing the first passivation film and the second passivation film above the drain electrode, the CIL hole part, and the ambient light sensor hole part, and forming a pixel electrode on the second passivation film at the pixel region so as to be electrically connected to the drain electrode.

In a further aspect of the present disclosure, a method of manufacturing a flat display panel includes preparing a first substrate, partitioned into a pixel region of a display area and a CIL hole part and an ambient light sensor hole part of a non-display area, forming a gate electrode on the first substrate at the pixel region, forming a gate insulating layer on the entire surface of the first substrate including the pixel region, the CIL hole part, and the ambient light sensor hole part, forming an active layer and source/drain electrodes on the gate insulating layer at the pixel region, forming a first passivation film on the entire surface of the first substrate including the pixel region, the CIL hole part, and the ambient light sensor hole part, selectively removing the gate insulating layer and the first passivation film above the CIL hole part and the ambient light sensor hole part, forming a planarization film on the entire surface of the first substrate, selectively removing the planarization film above the drain electrode, forming a second passivation film on the entire surface of the first substrate including the pixel region, the CIL hole part, and the ambient light sensor hole part, removing the first passivation film and the second passivation film above the drain electrode, removing the second passivation film above the CIL hole part and the ambient light sensor hole part, and forming a pixel electrode on the second passivation film at the pixel region so as to be electrically connected to the drain electrode.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Hereinafter, a flat display panel and a method of manufacturing the same according to the present disclosure will be described in detail with reference to the accompanying drawings.

Figure 1:
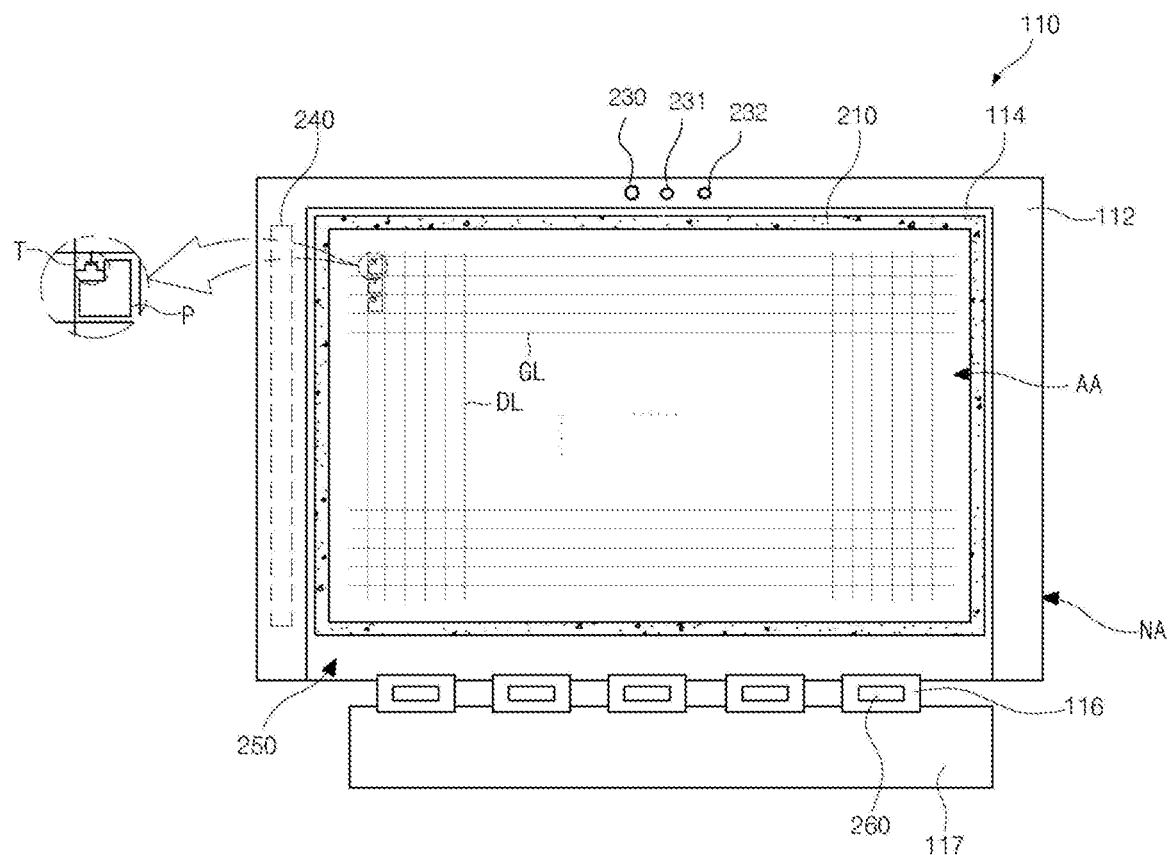
FIG. 1 is a plan view schematically showing a liquid crystal display panel, in which a general camera and an ambient light sensor are mounted.
Figure 2:
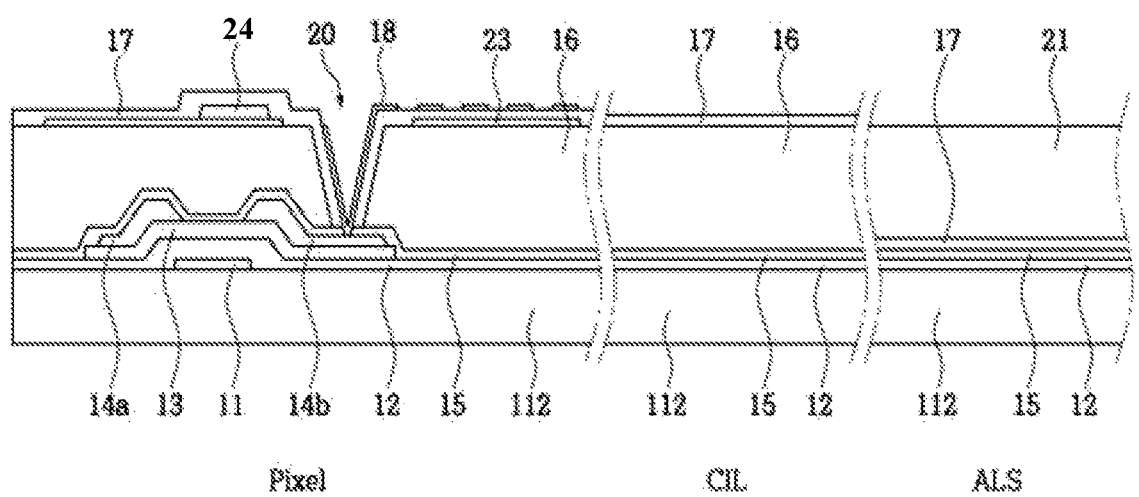
FIG. 2 is a sectional view showing the structure of a first substrate of FIG. 1.

A liquid crystal display panel 110 according to the present disclosure is similar in some respects to the liquid crystal display panel shown in FIG. 1, with certain key differences. For example, as will be discussed in further detail herein, the structure of a first substrate 112 at a CIL hole region 231 and an ambient light sensor hole region are different from a general structure.

That is, the liquid crystal display panel according to the present disclosure is configured such that a first substrate, which is a thin film transistor array substrate, and a second substrate, which is a color filter array substrate, are laminated in the state in which a liquid crystal layer is interposed therebetween.

The liquid crystal display panel generally includes a display area, on which an image is displayed, and a non-display area, on which various circuits and wires are formed and which is thus not used to display an image.

On the display area of the first substrate, a plurality of data lines and a plurality of gate lines intersect each other lengthwise and crosswise to define pixels. A thin film transistor is provided at the intersection of each of the data lines and a corresponding one of the gate lines so as to be individually connected to a pixel electrode provided at each pixel.

A camera hole, a camera index light source (CIL) hole, and an ambient light sensor hole are provided in the non-display area of the first substrate. A camera index light source (CIL) hole region, which may be referred to herein alternatively as a CIL hole part, corresponds with a region in which the CIL hole is formed. Similarly, an ambient light sensor hole region, which may be referred to herein alternatively as an ambient light sensor hole part, corresponds with a region in which the ambient light sensor hole is formed.

Consequently, the sectional structure of a pixel region Pixel of the display area AA, and the CIL hole part and the ambient light sensor hole part of the non-display area NA will be described in detail, and a description of the remaining parts of the liquid crystal display panel will be omitted, since the remaining parts of the liquid crystal display panel are identical to those of the liquid crystal display panel shown in FIG. 1.

Figure 3:
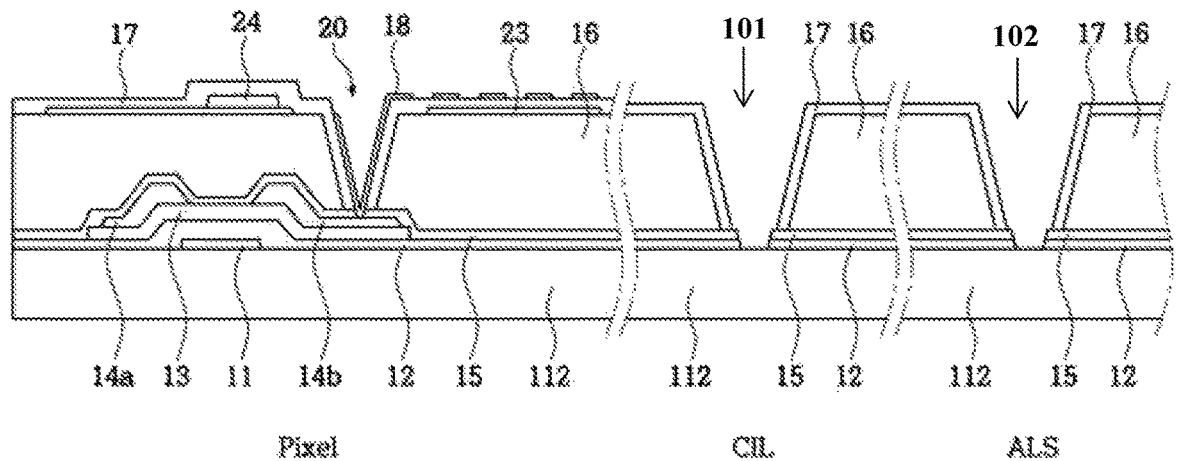
FIG. 3 is a sectional view showing the structure of a first substrate of a liquid crystal display panel according to a first embodiment of the present disclosure, in which a camera index light source and an ambient light sensor are mounted.

FIG. 3 is a sectional view showing the structure of a first substrate of a liquid crystal display panel according to a first embodiment of the present disclosure, in which a camera index light source and an ambient light sensor are mounted.

In the liquid crystal display panel according to the first embodiment of the present disclosure, a thin film transistor TFT, having a gate electrode 11, a gate insulating layer 12, an active layer 13, and source/drain electrodes 14a and 14b, is formed in a pixel region Pixel of a first substrate 112. A first passivation film 15 and a planarization film 16 are sequentially stacked on the entire surface of the first substrate 112, including the thin film transistor TFT.

A common electrode 23 and a common line 24 are formed on the planarization film 16. A second passivation film 17 is formed on the entire surface of the substrate, including the common electrode 23 and the common line 24. The second passivation film 17, the planarization film 16, and the first passivation film 15 above the drain electrode 14b are selectively removed to form a contact hole 20, and a pixel electrode 18 is formed on the second passivation film 17 so as to be electrically connected to the drain electrode 14b via the contact hole 20.

The pixel electrode 18 has a slit structure above the common electrode 23. Consequently, in-plane switching occurs between the pixel electrode 18 and the common electrode 23 to drive a liquid crystal layer.

None of the gate insulating layer 12, the first passivation film 15, the planarization film 16, and the second passivation film 17 are formed on the first substrate 112 at the CIL hole part CIL or at the ambient light sensor hole part ALS. That is, at least one of the CIL hole part CIL and the ambient light sensor hole part ALS includes a cavity 101, 102 which extends through the gate insulating layer 12, the first passivation film 15, the planarization film 16, and the second passivation film 17.

Hereinafter, a method of manufacturing the liquid crystal display panel according to the first embodiment of the present disclosure having the above structure, in which the camera index light source and the ambient light sensor are mounted, will be described.

FIGS. 4A to 4F are sectional views showing the process of manufacturing the liquid crystal display panel according to the first embodiment of the present disclosure, in which the camera index light source and the ambient light sensor are mounted.

First, the pixel region Pixel of the display area AA of the liquid crystal display panel, and the CIL hole part CIL and the ambient light sensor hole part ALS of the non-display area NA of the liquid crystal display panel will be individually described, as noted above.

Figure 4A:
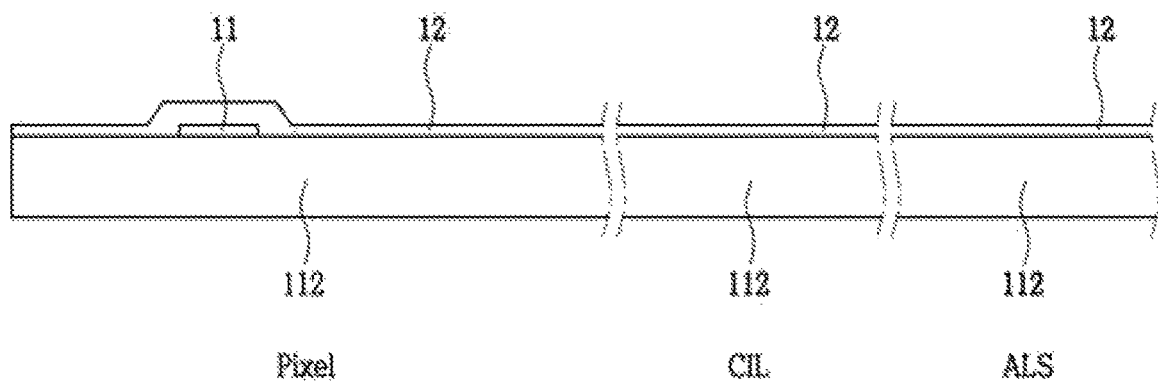
FIGS. 4A to 4F are sectional views showing the process of manufacturing the liquid crystal display panel according to the first embodiment of the present disclosure, in which the camera index light source and the ambient light sensor are mounted.

As shown in FIG. 4A, a metal layer is deposited on a first substrate 112, and the metal layer is selectively removed by photolithography and etching to form a gate electrode 11 and gate lines GL (see FIG. 1) on a display area.

Here, any low-resistance metal layer may be used as the metal layer. The metal layer may be formed to have a single metal layer or a plurality of metal layers that are stacked. For example, a MoTi layer and a copper (Cu) layer may be stacked.

A gate insulating layer 12 is formed on the entire surface of the substrate, including the gate electrode 11. For example, a SiNx layer may be used as the gate insulating layer 12.

That is, the gate electrode 11 and the gate insulating layer 12 are formed on the first substrate 112 at the pixel region of the display area, and only the gate insulating layer 12 is formed on the first substrate 112 at the CIL hole part CIL and the ambient light sensor hole part ALS of the non-display area NA.

Figure 4B:
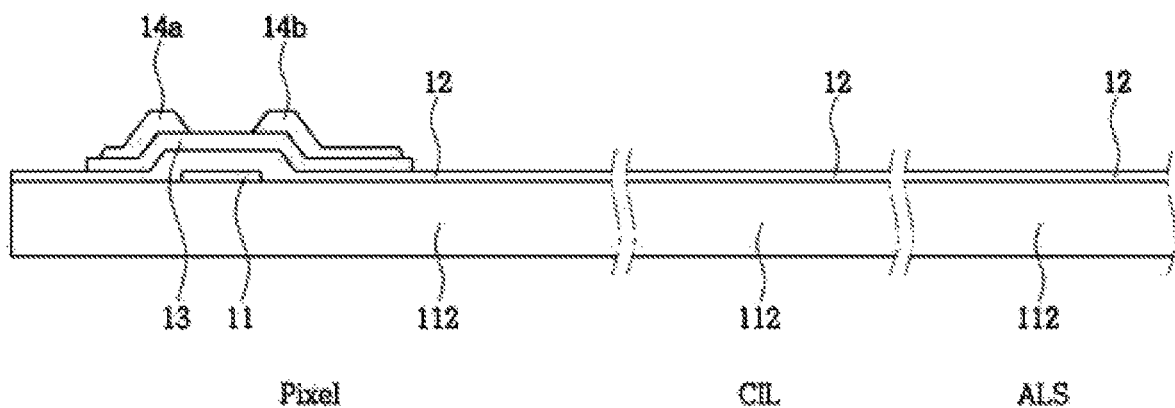

As shown in FIG. 4B, a semiconductor layer is deposited on the gate insulating layer 12, and the semiconductor layer is selectively removed by photolithography and etching to form an active layer 13 above the gate electrode 11.

Although not shown, a semiconductor layer doped with a dopant may be further deposited on the semiconductor layer, and the semiconductor layer and the semiconductor layer doped with the dopant may be selectively removed by photolithography and etching to form an active layer 13.

Subsequently, a metal layer is deposited on the entire surface of the substrate, including the active layer 13, and the metal layer is selectively removed by photolithography and etching to form data lines DL (see FIG. 1) and source/drain electrodes 14a and 14b on the display area. Consequently, a thin film transistor is formed by the gate electrode 11, the active layer 13, and the source/drain electrodes 14a and 14b.

Here, any low-resistance metal layer may be used as the metal layer. The metal layer may be formed to have a single metal layer or a plurality of metal layers that are stacked. For example, a MoTi layer and a copper (Cu) layer may be stacked.

In the case in which the semiconductor layer doped with the dopant has been further formed, as described above, the portion of the semiconductor layer doped with the dopant corresponding to a channel region between the source electrode 14a and the drain electrode 14b is removed when the source/drain electrodes 14a and 14b are formed.

Figure 4C:
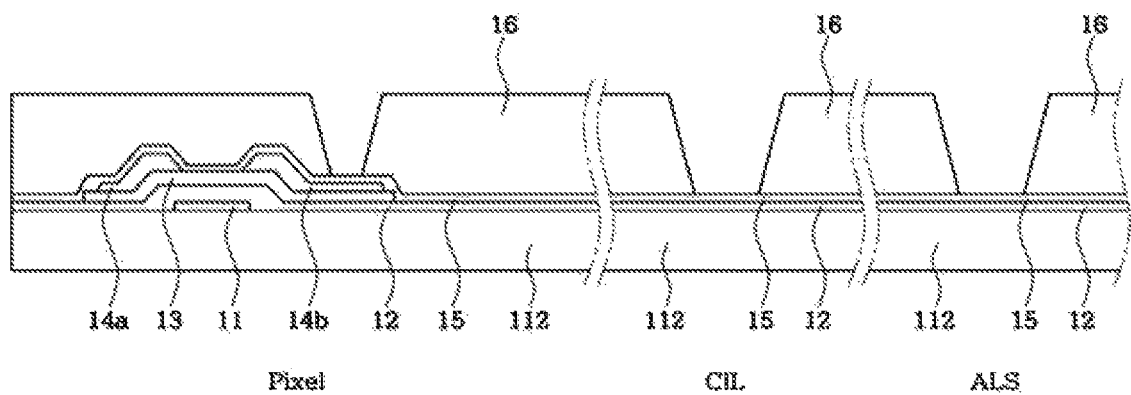

As shown in FIG. 4C, a first passivation film 15 and a planarization film 16 are sequentially formed on the entire surface of the first substrate 112, including the thin film transistor.

Subsequently, the planarization film 16 above the drain electrode 14b, the CIL hole part CIL, and the ambient light sensor hole part ALS is selectively removed by photolithography and etching.

Figure 4D:
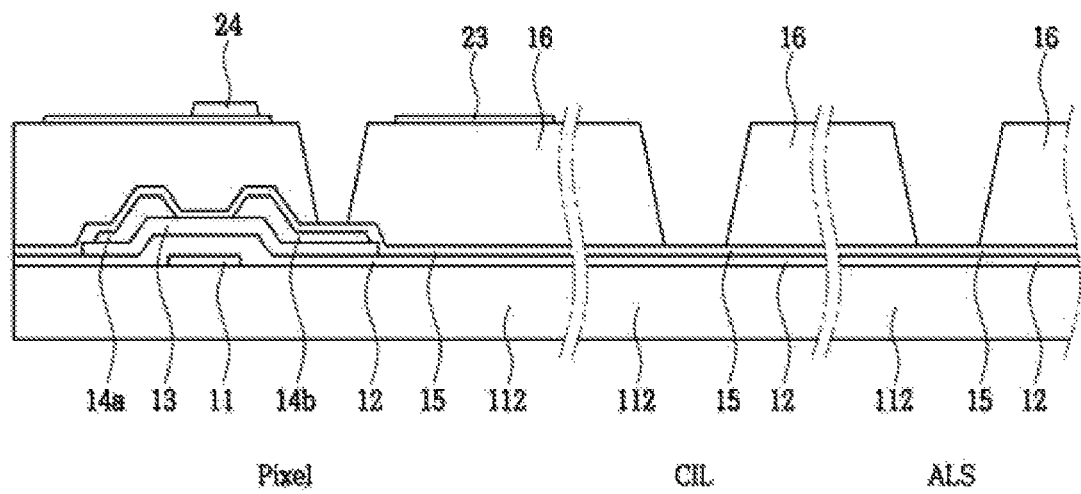

As shown in FIG. 4D, a transparent conductive layer and a metal layer are deposited on the planarization film 16, and the transparent conductive layer and the metal layer are selectively removed by photolithography and etching using a half-tone mask (HTM) to form a common electrode 23 and a common line 24.

Here, the half-tone mask (HTM) is configured to block light at a part corresponding to the common line 24, to half transmit light at a part corresponding to the common electrode 23, and to fully transmit light at the remaining part.

Although not shown, therefore, when the transparent conductive layer, the metal layer, and a photosensitive film are sequentially deposited on the planarization film 16 and then light exposure and development are performed using the half-tone mask (HTM), the remaining part excluding the parts corresponding to the common line 24 and the common electrode 23 is removed, and the photosensitive film is patterned such that the part corresponding to the common line 24 is thicker than the part corresponding to the common electrode 23.

The transparent conductive layer and the metal layer are primarily removed using the patterned photosensitive film as a mask to form the common electrode 23. The patterned photosensitive film is ashed such that the part corresponding to the common electrode 23 is removed and the part corresponding to the common line 24 is left.

The metal layer is removed using the ashed photosensitive film as a mask to form the common line 24, as shown in FIG. 4D. At this time, the common line 24 and the common electrode 23 are not formed at the CIL hole part CIL or at the ambient light sensor hole part ALS.

Figure 4E:
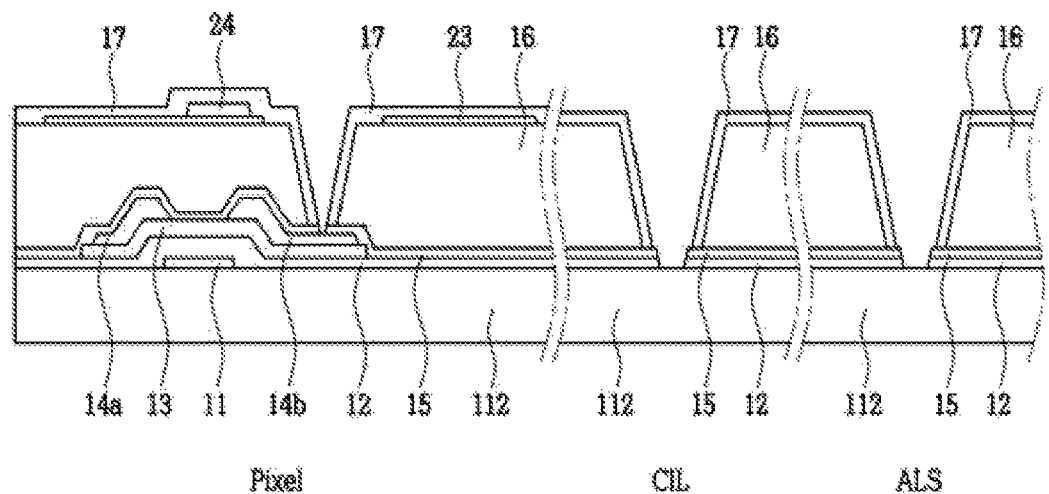

As shown in FIG. 4E, a second passivation film 17 is formed on the entire surface of the substrate, including the common line 24 and the common electrode 23, and the first passivation film 15 and the second passivation film 17 above the drain electrode 14b, the CIL hole part CIL, and the ambient light sensor hole part ALS are selectively removed by photolithography and etching, thereby forming the cavities 101, 102 in the CIL hole part CIL and the ambient light sensor hole part ALS, respectively.

Figure 4F:
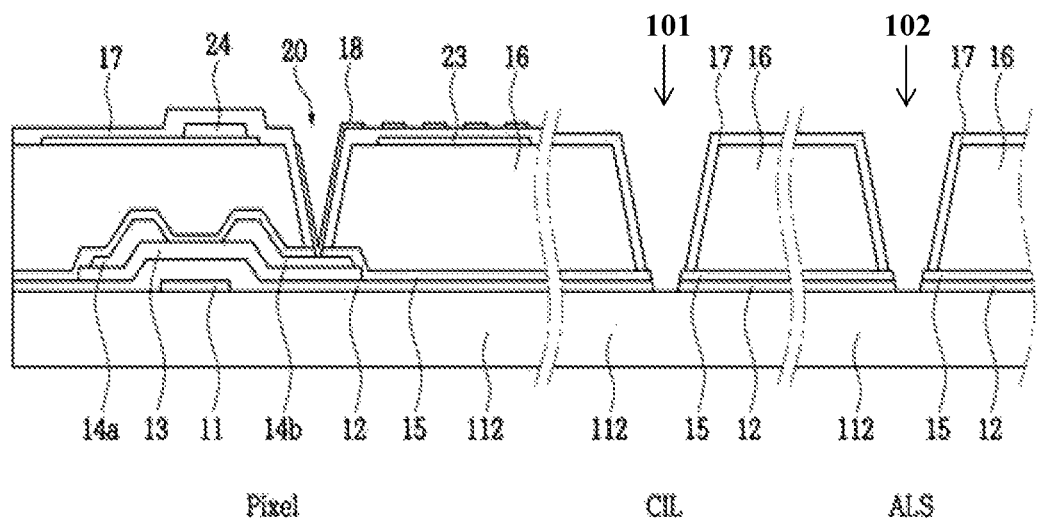

As shown in FIG. 4F, a transparent conductive film is deposited on the entire surface of the substrate, and the transparent conductive film is selectively removed by photolithography and etching to form a pixel electrode 18 at each pixel region.

At this time, the pixel electrode 18 is electrically connected to the drain electrode 14b, and has a slit structure above the common electrode 23. Consequently, in-plane switching occurs between the pixel electrode 18 and the common electrode 23 to drive a liquid crystal layer.

At this time, no pixel electrode 18 is formed at the CIL hole part CIL or at the ambient light sensor hole part ALS. Furthermore, none of the gate insulating layer 12, the first passivation film 15, the planarization film 16, and the second passivation film 17 are formed at the CIL hole part CIL or at the ambient light sensor hole part ALS.

As described above, the flat display panel according to the present disclosure and the method of manufacturing the same have been described based on a liquid crystal display panel by way of example. However, the present disclosure is not limited thereto. Even an OLED display panel may be configured such that none of the gate insulating layer, the first passivation film, the planarization film, and the second passivation film are formed at the CIL hole part CIL or at the ambient light sensor hole part ALS of the non-display area.

Figure 5:
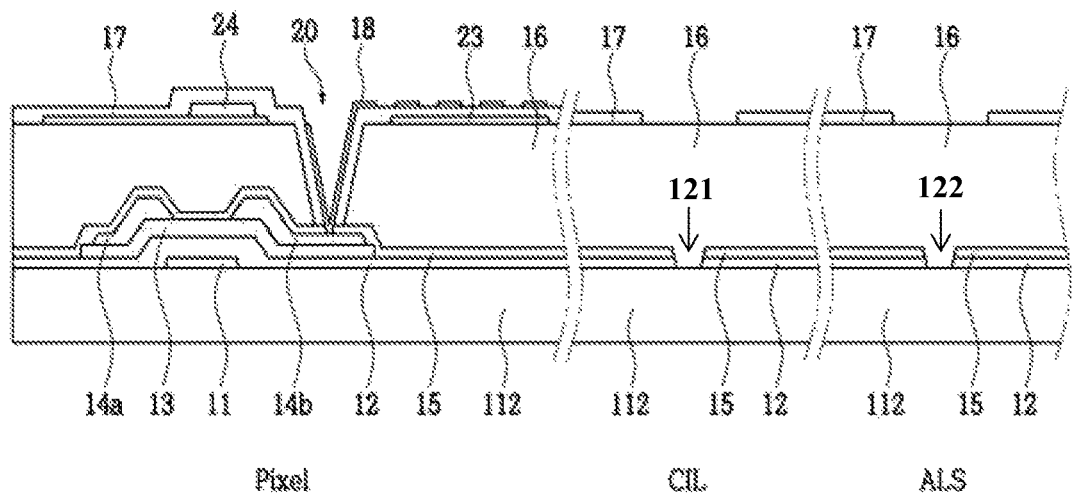
FIG. 5 is a sectional view showing the structure of a first substrate of a liquid crystal display panel according to a second embodiment of the present disclosure, in which a camera index light source and an ambient light sensor are mounted.

FIG. 5 is a sectional view showing the structure of a first substrate of a liquid crystal display panel according to a second embodiment of the present disclosure, in which a camera index light source and an ambient light sensor are mounted.

In the liquid crystal display panel according to the second embodiment of the present disclosure, none of the gate insulating layer, the first passivation film, and the second passivation film are formed at the CIL hole part CIL or at the ambient light sensor hole part ALS, excluding the planarization film. The same effects may be obtained even when only the planarization film is formed.

The method of manufacturing the flat display panel according to the second embodiment of the present disclosure is similar to the method shown in FIGS. 4A to 4F; however, there is a slight difference in FIGS. 4C and 4E.

That is, in FIG. 4C, after the first passivation film 15 is deposited on the entire surface of the first substrate 112 and before the planarization film 16 is deposited, the gate insulating layer 12 and the first passivation film 15 at the CIL hole part CIL and the ambient light sensor hole part ALS are removed using an additional mask. This forms cavities 121, 122 (see FIG. 5) which extend through the gate insulating layer 12 and the first passivation film 15.

In addition, when the planarization film 16 is deposited and the planarization film 16 above the drain electrode 14b is selectively removed, the planarization film 16 at the CIL hole part CIL and the ambient light sensor hole part ALS is not removed. That is, the planarization film 16 may remain in the cavities 121, 122 at the CIL hole part CIL and the ambient light sensor hole part ALS.

In addition, as shown in FIG. 4E, the second passivation film 17 is formed on the entire surface of the substrate, the gate insulating layer 12 and the second passivation film 17 above the drain electrode 14b are selectively removed, and the second passivation film 17 above the CIL hole part CIL and the ambient light sensor hole part ALS is selectively removed.

Through the above process, only the planarization film 16 may be left at the CIL hole part CIL and the ambient light sensor hole part ALS, and the gate insulating layer 12, the first passivation film 15, and the second passivation film 17 may be removed at the CIL hole part CIL and the ambient light sensor hole part ALS.

As is apparent from the above description, the flat display panel according to the present disclosure and the method of manufacturing the same have the following effects.

None of the gate insulating layer, the first passivation film, the planarization film, and the second passivation film are formed at the CIL hole part CIL or at the ambient light sensor hole part ALS, or only the planarization film is formed at the CIL hole part CIL and the ambient light sensor hole part ALS. When camera light is turned off under normal luminance conditions, therefore, an appearance is not different at a side viewing angle between the CIL hole and the ambient light sensor hole, whereby the quality of the display panel is improved.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A flat display panel, comprising:
a first substrate, partitioned into a pixel region in a display area and a camera index light source hole region and an ambient light sensor hole region in a non-display area;
a thin film transistor on a surface of the first substrate in the pixel region, the thin film transistor having a gate electrode, a gate insulating layer, an active layer, and source/drain electrodes;
a first passivation film and a planarization film sequentially stacked on the surface of the first substrate, the first passivation film and the planarization film at least partially overlying the thin film transistor;
a second passivation film overlying the surface of the first substrate; and
a pixel electrode on the second passivation film in the pixel region, the pixel electrode electrically connected to the drain electrode via a contact hole which extends through the second passivation film, the planarization film, and the first passivation film above the drain electrode,
wherein at least one of the camera index light source hole region and the or the ambient light sensor hole region includes a cavity that extends through the gate insulating layer, the first passivation film, the planarization film, and the second passivation film.

2. The flat display panel according to claim 1, further comprising a common electrode and a common line formed in the pixel region between the planarization film and the second passivation film.

3. The flat display panel according to claim 1 wherein each of the camera index light source hole region and the ambient light sensor hole region includes a respective cavity that extends through the gate insulating layer, the first passivation film, the planarization film, and the second passivation film.

4. The flat display panel according to claim 1 wherein the second passivation film overlies the planarization film in the display area.

5. The flat display panel according to claim 4 wherein the planarization film is disposed directly between the first passivation film and the second passivation film in the display area.

6. The flat display panel according to claim 1 wherein the second passivation film contacts side surfaces of the planarization film in the cavity.

7. The flat display panel according to claim 1 wherein the cavity exposes a portion of the surface of the first substrate.

8. A flat display panel, comprising:
a first substrate, partitioned into a pixel region in a display area and a camera index light source hole region and an ambient light sensor hole region in a non-display area;
a thin film transistor on a surface of the first substrate in the pixel region, the thin film transistor having a gate electrode, a gate insulating layer, an active layer, and source/drain electrodes;
a first passivation film and a planarization film sequentially stacked on the surface of the first substrate, the first passivation film and the planarization film at least partially overlying the thin film transistor;
a second passivation film overlying the surface of the first substrate; and
a pixel electrode on the second passivation film in the pixel region, the pixel electrode electrically connected to the drain electrode via a contact hole which extends through the second passivation film, the planarization film, and the first passivation film above the drain electrode,
wherein at least one of the camera index light source hole region or the ambient light sensor hole region includes only the planarization film on the first substrate.

9. The flat display panel according to claim 8, further comprising a common electrode and a common line formed in the pixel region between the planarization film and the second passivation film.

10. The flat display panel according to claim 8 wherein the second passivation film overlies the planarization film in the display area.

11. The flat display panel according to claim 10 wherein the planarization film is disposed directly between the first passivation film and the second passivation film in the display area.

12. The flat display panel according to claim 8 wherein the second passivation film includes an opening overlying the camera index light source hole region or the ambient light sensor hole region.

* * * * *

UNITED STATES PATENT AND TRADEMARK OFFICE
CERTIFICATE OF CORRECTION

PATENT NO. : 10,712,594 B2  
APPLICATION NO. : 15/980098  
DATED : July 14, 2020  
INVENTOR(S) : Suk-Ho Cho Page 1 of 1

It is certified that error appears in the above-identified patent and that said Letters Patent is hereby corrected as shown below:

In the Claims

Column 10, Line 19 Claim 1:
"region and the or the ambient light sensor hole region" should be: --region or the ambient light sensor hole region--.

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*